(12) United States Patent
Mikolajick et al.

(10) Patent No.: US 7,521,351 B2
(45) Date of Patent: Apr. 21, 2009

(54) METHOD FOR FORMING A SEMICONDUCTOR PRODUCT AND SEMICONDUCTOR PRODUCT

(75) Inventors: Thomas Mikolajick, Dresden (DE); Torsten Mueller, Dresden (DE); Nicolas Nagel, Dresden (DE); Lars Bach, Ullersdorf (DE); Dominik Olligs, Dresden (DE); Veronika Polei, Dresden (DE)

(73) Assignee: Infineon Technologies AG, Munich (DE)

( * ) Notice: Subject to any disclaimer, the term of this patent is extended or adjusted under 35 U.S.C. 154(b) by 330 days.

(21) Appl. No.: 11/172,366

(22) Filed: Jun. 30, 2005

(65) Prior Publication Data

US 2007/0001305 A1 Jan. 4, 2007

(51) Int. Cl.
 *H01L 21/4763* (2006.01)
(52) U.S. Cl. .............................. 438/622; 257/E31.124; 257/E23.151; 257/E21.575
(58) Field of Classification Search ................. 438/622; 257/E21.575, 585, 599, 597, E23.09, E23.151, 257/E31.124
See application file for complete search history.

(56) References Cited

U.S. PATENT DOCUMENTS 5,188,975 A * 2/1993 Kojima et al. ............... 438/396

| 6,083,824 | A | 7/2000 | Tsai et al. |
| 6,114,237 | A | 9/2000 | Huh |
| 6,350,687 | B1 | 2/2002 | Avanzino et al. |
| 6,593,609 | B2 * | 7/2003 | Shinkawata ................. 257/296 |
| 6,815,778 | B2 | 11/2004 | Ishibashi et al. |
| 2001/0023991 | A1 | 9/2001 | Kakuhara |
| 2002/0036347 | A1 | 3/2002 | Houston |
| 2002/0179986 | A1 | 12/2002 | Yeno et al. |
| 2003/0119324 | A1 | 6/2003 | Jung et al. |
| 2003/0151082 | A1 * | 8/2003 | Kim et al. ................... 257/306 |
| 2006/0228880 | A1 * | 10/2006 | McDaniel et al. ........... 438/625 |

* cited by examiner

*Primary Examiner*—Zandra V. Smith
*Assistant Examiner*—Sonya D. McCall Shepard
(74) *Attorney, Agent, or Firm*—Slater & Matsil, L.L.P.

(57) ABSTRACT

A semiconductor product includes, a substrate with a first dielectric layer having contact hole fillings for contacting active areas in the substrate. A second dielectric layer with contact holes is provided therein. The contact holes have a width in a first lateral direction. The product further includes conductive lines, each conductive line passing over contact holes in the second dielectric layer and contacting a plurality of contact hole fillings in the first dielectric layer. The conductive lines have a width, in the first lateral direction, that is smaller than the width of the contact holes of the second dielectric layer. The conductive lines are in direct mechanical contact with the contact hole fillings and thereby remove the need to provide any conventional "contact to interconnect" structures.

22 Claims, 7 Drawing Sheets

METHOD FOR FORMING A SEMICONDUCTOR PRODUCT AND SEMICONDUCTOR PRODUCT

TECHNICAL FIELD

The invention relates to a method for forming a semiconductor product and to a semiconductor product, in particular to a semiconductor product comprising a substrate, first and second dielectric layers with contact holes therein filled with contacts and further comprising a plurality of conductive lines passing over the second dielectric layer.

BACKGROUND

Semiconductor products are included, for instance, flash memory products comprising a plurality of memory cells like NROM (nitride read only memory) or alternative kinds of non-volatile memory cells like floating gate cells. In a flash memory, the memory cells are programmable individually selectively to the respective other memory cells. When information is deleted, all memory cells of the same particular sector are commonly deleted at the same time. The memory cells of the respective sector may be later reprogrammed individually.

The memory cells of a flash memory are arranged in a virtual ground array or in other array architectures. Each memory cell is connected to two respective bitlines running parallel to one another. In a virtual ground array each bitline is connected to memory cells arranged on opposed sides of the bitline. Connection between the bitlines and the memory cells is provided by contact structures which comprise first contacts called "local interconnect". The local interconnects are arranged in rows extending perpendicular to the direction of the bitlines. In direction parallel to the bitlines, a bitline is connected to one respective local interconnect of every other row of local interconnects. Furthermore, in every other row, the local interconnects have a lateral offset relative to the lateral positions of the local interconnects of the other rows of local interconnects. Each bitline is connected to local interconnects of every other row (for instance of a first, third, fifth etc. row) whereas the bitline is passing over memory cells of a second, fourth, sixth etc. row of local interconnects without being connected to the local interconnects of the second, fourth and sixth row.

In a virtual ground array, the bitlines are connected to the memory cells via contact structures which, according to prior art, comprise a first contact called "local interconnect". The local interconnects are contact hole fillings provided in a dielectric layer above a substrate. The local interconnects are wide via contacts having a main extension in a first lateral direction perpendicular to the direction of the bitlines. They serve to connect two line-shaped active areas, seen from top view on the main surface of the semiconductor substrate, to a bitline. The active areas are doped regions providing the source/drain regions and the channel regions and, in a virtual ground array, are formed in lines or stripes separated from one another by trench insulation fillings like shallow trench isolations (STI). The trench isolation fillings as well as the active areas are formed line-shaped in top view on the semiconductor substrate. When the bitlines are formed, they are positioned such that they are running parallel to the active areas but are located at same lateral positions as the shallow trench isolation fillings, that is, at lateral positions centered between two respective adjacent line-shaped active areas.

The local interconnects contacts, in direction perpendicular to the active areas, extend beyond the bitlines on opposed sides of the respective bitline. In particular, the local interconnects extend to the active areas next to the bitline positioned on opposed sides of the bitline. Typically a local interconnect has a width being three times the width of the bitline since the width of the active areas and the trench isolation fillings between the active areas correspond to one another.

In order to connect the bitline to the local interconnects which are much wider than the bitlines, second contacts (the "contacts to interconnect") are formed according to prior art. To this end, a second dielectric layer is deposited on the first dielectric layer and via contact holes are etched in the second dielectric layer so as to expose a portion of an upper surface of the local interconnects. The contact holes in the second dielectric layer are then filled with conductive material. By planarizing the conductive material, the contacts to interconnect are formed. Subsequently, according to prior art the bitlines are to be formed in an aligned position relative to the contacts to interconnect. To this end, a conductive layer is deposited on the intermediate semiconductor product and is patterned using lithographic techniques. However, lithographic patterning requires alignment of the lithographic mask for bitline formation in lateral direction relative to the contacts to interconnect. However, there is a risk of misalignments of the bitlines relative to the contacts to interconnect. Furthermore, the formation of the contacts to interconnect bears the risk of structural defects of the contacts to interconnect since the vias in the second dielectric layer have small dimensions in two lateral directions, thereby reducing the process window for lithographic parameters.

Furthermore, in case of misalignment in direction perpendicular to the active areas during bitline etching, there is a risk that two adjacent bitlines are offset such that they both are connected to the same contact to interconnect and are thus short-circuited to one another. In such a case, the bitlines are approximately located at positions at which dielectric material surrounding the bitlines is actually intended to be located. Accordingly, correct alignment of the bitlines relative to the contact to interconnect structures is critical.

In particular in case that, in direction perpendicular to the active areas, the contact holes in the second dielectric layer are significantly offset with respect to the bitline positions, the contact to interconnect structures filling the contact holes are arranged closer to an adjacent bitline. An adjacent bitline, especially in case of additional misalignment of the bitlines, may easily contact the contact to interconnect structure and thereby may be short-circuited to that bitline, which should pass over the contact to interconnect structure in a laterally centered position. Accordingly, the risk of bitline-to-bitline shorts is rather high.

SUMMARY OF THE INVENTION

In one aspect, the present invention reduces the risk of bitline-to-bitline shorts and bitline-to-contacts to interconnect shorts, in particular at an upper side of the contacts to interconnect. In a further aspect, the invention provides a semiconductor product and a method for its manufacture providing increased protection against short-circuits in the wiring connecting the memory cells.

In a preferred embodiment, a semiconductor product is formed. A substrate including active areas is provided. A first dielectric layer is deposited. Contact holes are etched in the first dielectric layer for contacting the active areas. A first conductive layer is deposited, thereby filling the contact holes in the first dielectric layer. The first conductive layer is etched thereby forming a plurality of contact hole fillings in the first dielectric layer. A second dielectric layer is deposited. Contact holes are etched in the second dielectric layer. Each contact hole in the second dielectric layer exposes a portion of a surface of a respective contact hole filling of the first dielectric layer and has a width in a first lateral direction. A second conductive layer is deposited, filling the contact holes in the second dielectric layer and covering the second dielectric layer. The second conductive layer is patterned thereby forming conductive lines. Each conductive line passing over a plurality of contact holes of the second dielectric layer and having a width in the first lateral direction being smaller than the width of the contact holes of the second dielectric layer.

In one embodiment, the conductive material of the second conductive layer that is provided in the contact holes of the second dielectric layer and that is arranged, in the first lateral direction, outside the width of the respective conductive line passing over the respective contact hole is removed or at least recessed below the upper surface of the second dielectric layer.

After forming contact hole fillings in a first dielectric layer provided on a substrate, a second dielectric layer is deposited, contact holes are etched therein and a second conductive layer is deposited. According to embodiments of the invention, the second conductive layer is patterned to form both the bitlines and the contact to interconnect structures, which conventionally connect the lower surface of the bitlines to the upper surface of the local interconnect structures. The local interconnect structures are contact hole fillings, filling the contact holes in the first dielectric layer. In a conventional semiconductor product, the contact to interconnect structures are contact hole fillings being formed in separate process steps and are filling the contact holes in the second dielectric layer.

According to embodiments of the invention, however, no separate process steps are required for forming contacts to interconnect between the bitlines and the contact hole fillings in the first dielectric layer (local interconnects) since the second conductive layer is deposited on the exposed contact holes in the second dielectric layer serves to form both the bitlines and the contacts to interconnect. For instance, the second conductive layer may be etched such that the etching depth extends to the bottom of the contact holes in the second dielectric layer (or at least extends beyond the upper circuits of the second dielectric layer). Since each bitline is passing over a respective plurality of contact holes in the second dielectric layer, each bitline contacts the bottom surface of the contact hole and thereby exposes a portion of an upper surface of a respective contact hole filling in the first dielectric layer (local interconnect).

Furthermore, according to the invention, the patterning of the second conductive layer is performed such that conductive material of the second conductive layer (which is provided in the contact holes of the second dielectric layer) is removed or at least recessed in regions laterally adjacent to the width of the bitline, which is passing over the respective contact hole of the second dielectric layer. Since the width of the bitline is smaller than the width of the contact hole in the first lateral direction, any conductive material of the second conductive layer is removed from the contact hole or at least recessed within the contact hole to the height below the height of an upper surface of the second dielectric layer. Complete removal of conductive material of the second conductive layer is achieved by suitably large etching duration during the bitline patterning, thereby etching back the second conductive layer to the bottom of the contact holes in the second dielectric layer. Recessing of the conductive material within the contact holes, is achieved by continuing the etching used for bitline patterning, even after the upper surface of the first dielectric layer is exposed between the bitlines.

Embodiments of the invention provide a vertical distance between any conductive material outside the width of a bitline and connected to the bitline from an adjacent bitline. In case of complete removal of conductive material laterally outside of the width of the bitline, the vertical distance is the distance between the upper side of the contact hole filling in the first dielectric layer and the lower surface of the adjacent bitline. This distance corresponds to the thickness of the second dielectric layer. Alternatively, in case of only partial recessing of conductive material in the contact hole of the second dielectric layer, the vertical distance is adjusted by the duration of continued bitline patterning, thereby recessing the upper surface of the conductive material laterally outside the bitline. The depth of recessing should be at least 10% of the thickness of the second dielectric layer, preferably between 20 and 90% of the thickness of the second dielectric layer and at least 20 nm. Of course, the depth of recessing can also be more than 90% of the thickness of the second dielectric layer up to 100% thereof.

Preferably, however, the conductive material that is provided in the contact holes of the second dielectric layer and that is arranged, in the first lateral direction, outside the width of the respective conductive line passing over the respective contact hole, is removed completely. Thereby a conductive line portion connecting the bitline passing over the contact hole with the contact hole filling provided below the contact hole is formed, the conductive line portion having the same width as the conductive line. Accordingly, on opposed sides of the conductive line (bitline), opposed outer portions of the contact hole in the second dielectric layer are reopened during continued bitline patterning. Subsequently, the reopened outer portions of the contact hole may be filled with dielectric material of a dielectric layer surrounding the conductive lines.

According to the above embodiment, while patterning the second conductive layer, portions of upper surfaces of the contact hole fillings in the first dielectric layer are preferably exposed when the conductive material arranged in the contact holes of the second dielectric layer is removed outside the width of the conductive lines. When the upper side of the contact hole fillings is exposed, continued bitline patterning is finished.

Accordingly, this patterning step preferably recesses between sidewalls of the contact holes of the second dielectric layer and sidewalls of conductive line portions are formed outside the width of the conductive lines, the recesses exposing the contact hole fillings provided in the first dielectric layer. The conductive line portions maintained in the contact holes of the second dielectric layer, provide an electrical contact of the bitline passing over the respective contact hole with the contact hole filling exposed at the bottom of the contact hole of the second dielectric layer. Accordingly, the conductive line portions correspond to the prior art contact to interconnect structures which in prior art processes require separate process steps. Since according to the invention the second conductive layer is deposited directly on the open contact holes in the second dielectric layer, no separate process steps for forming the conductive line portions are required.

According to an alternative embodiment, the conductive material arranged in the contact holes of the second dielectric layer outside the width of the respective conductive line is recessed below the upper surface of the second dielectric layer, thereby forming recesses having a depth larger than 10% of a thickness of the second dielectric layer.

Accordingly, conductive material is maintained in the contact holes outside the width of the respective conductive line passing over the contact hole, the conductive material maintained outside the width of the conductive line being arranged at a vertical distance from the upper surface of the second dielectric layer in direction normal to the main surface of the substrate. Though the bottom of the contact hole in the second dielectric layer is completely covered with the conductive material, the upper side of the contact hole comprises recesses on opposed sides of the conductive bitline. The upper surface of conductive material maintained in the contact hole outside the width of the conductive line, has a height being smaller than the height of the upper surface of the second dielectric layer, but being larger than the height of the lower surface of the second dielectric layer.

Preferably, the method according to the invention comprises a further step of depositing a third dielectric layer, thereby filling portions of the contact holes of the second dielectric layer provided outside the width of the conductive lines passing over the respective contact holes with dielectric material.

By depositing dielectric material in the contact holes of the second dielectric layer, any conductive material maintained in the contact holes outside the width of the bitline is encapsulated by dielectric material. The dielectric material reduces the risk of short circuits between an adjacent conductive line and the conductive line passing over the contact hole of the second dielectric layer.

Preferably, the third dielectric layer is deposited such that spaces between the conductive lines are filled and the conductive lines are encapsulated by dielectric material. In particular, the spaces between conductive lines adjacent to one another are filled and any recesses in the second dielectric layer laterally outside the bitlines are filled with dielectric material.

Preferably, etching the first conductive layer includes planarizing the first conductive layer, thereby exposing an upper surface of the first dielectric layer. Preferably, the first conductive layer is etched by chemical-mechanical polishing in order to achieve that the upper surface of the contact hole fillings is flush with the upper surface of the first dielectric layer.

Preferably, etching contact holes in the second dielectric layer includes reactive ion etching of the second dielectric layer.

Preferably, a substrate comprising active areas formed line-shaped and extending along a second lateral direction is provided. The first lateral direction is perpendicular to a main direction of conductive lines (bitlines) whereas the second lateral direction is parallel to the conductive lines. When a substrate is provided, patterned active areas are formed in lines or stripes (seen from top view on the main surface of the substrate), the first lateral direction being perpendicular to the main extension of the line-shaped active areas. Preferably, the substrate further includes forming trench isolation fillings (e.g., shallow trench isolations; STI) between the line-shaped active areas. Alternatively, trench isolation fillings are formed first in the substrate prior to implanting dopants therein which form the active areas. In both cases, a substrate comprising line-shaped trench isolation fillings and line-shaped active areas is provided.

Preferably, when the second conductive layer is patterned, conductive lines running along the second lateral direction (that is parallel to the line-shaped active areas) are formed.

Due to a preferred embodiment for manufacturing flash memory products, contact hole fillings exposing portions of two respective line-shaped active areas and passing across one respective trench isolation filling are formed. In flash memory products like NROM memory products (nitride read only memory) having memory cells arranged in a virtual ground array, the contact hole fillings in the first dielectric layer (that is the local interconnects) in lateral direction have a main extension perpendicular to the main extension of the active areas and of the shallow trench isolation fillings. Typically, the main extension in direction perpendicular to the active areas is three times the width of an active area (or of a trench isolation filling), the contact hole filling connecting a portion of an upper surface of a first line-shaped active area to a portion of an upper surface of an adjacent, second line-shaped active area. The contact hole filling accordingly is crossing over a trench isolation filling arranged between both active areas.

Preferably, conductive lines that are smaller in the first lateral direction than a width of the contact hole fillings of the first dielectric layer are formed.

Preferably, the width of the contacts holes of the second dielectric layer, in the first lateral direction, is less than a width of the contact hole fillings of the first dielectric layer. In particular, the width of the contact holes in the first lateral direction is larger than the width of the conductive lines but smaller than the width of the contact hole fillings in the first dielectric layer.

According to a preferred embodiment using NROM technology, a substrate comprising a charge trapping layer disposed above the active areas is provided. Etching contact holes in the first dielectric layer includes locally etching through the charge trapping layer. Preferably the charge trapping layer is sandwiched between a bottom oxide layer and a top oxide layer. Accordingly, the bottom oxide, the charge trapping layer and the top oxide layer are deposited on the substrate prior to depositing a first dielectric layer. Preferably the charge trapping layer is a nitride layer, in particular a silicon nitride layer.

Preferably, wordlines are formed which extend along the first lateral direction and which are crossing over the active areas. The wordlines are extending perpendicular to the line-shaped active areas and perpendicular to the bitlines to be formed later.

Preferably, the contact hole fillings are formed such that each contact hole filling contacts two respective line-shaped active areas separated from one another by one single trench isolation filling.

Preferably, the contact hole fillings in the first dielectric layer are located such that two respective line-shaped active areas separated from one another by one single trench isolation filling are commonly contacted by every other contact hole filling arranged along the second lateral direction. In a virtual ground array the contact hole fillings are arranged in rows parallel to the first direction, each contact hole filling having its lateral main extension along the first direction. In the second direction, plural rows of contact hole fillings are arranged. In two respective rows adjacent to one another, the respective contact hole fillings are laterally offset with respect to one another along the first direction. The amount of lateral offset along the first direction is half of the pitch distance between adjacent contact hole fillings of the same row of contact hole fillings along the first lateral direction. Accordingly, a particular pair of active areas adjacent to one another is contacted by contact hole fillings of every other row of contact hole fillings.

In another embodiment, a semiconductor product includes a substrate having active areas. A first dielectric layer includes a plurality of contact holes filled with contact hole fillings for contacting the active areas. A second dielectric layer has an upper surface. Contact holes are provided in the second dielectric layer. A plurality of conductive lines are provided so that each conductive line passes over a plurality of contact holes of the second dielectric layer and contact a plurality of contact hole fillings of the first dielectric layer. The conductive lines extend along a second lateral direction and have a width, in the first lateral direction, that is smaller than the width of the contact holes of the second dielectric layer.

According to embodiments of the invention the conductive lines contact the contact hole fillings in the first dielectric layer. This means that the conductive lines extend to the bottom of the contact holes of the second dielectric layer and thus are abutting to the contact hole fillings in the first dielectric layer. The upper surface of a contact hole filling in the first dielectric layer is covered with conductive material of the respective conductive line passing over the respective contact hole in the second dielectric layer, and extending into the contact hole of the second dielectric layer. Accordingly, no separate contact to interconnect structure conventionally required for connecting the bitlines to the contact hole fillings (interconnect structures) is required according to the present invention. The conductive lines are in direct mechanical contact with the contact hole fillings and thereby remove the need to provide any conventional "contact to interconnect" structures.

Preferably, the conductive lines passing over the contact holes of the second dielectric layer comprise conductive line portions arranged in the respective contact hole extending to a respective contact hole filling of the first dielectric layer. The conductive line portions have a width being equal to or larger than the width of the respective conductive line. Preferably, the width of the conductive line portion is equal to the width of the conductive line passing over the respective contact hole of the second dielectric layer.

Preferably, the conductive line portions arranged in the contact holes in the first lateral direction have a width being equal to the width of the conductive line and being smaller than the width of the contact holes in the first lateral direction.

Accordingly, recesses between sidewalls of the contact holes of the second dielectric layer and sidewalls of the conductive line portions are formed. These recesses are preferably filled with a third dielectric layer extending into the contact holes and surrounding the conductive lines.

Preferably material of the third dielectric layer arranged in the contact holes outside the width of the conductive lines extends to the contact hole fillings of the first dielectric layer. Dielectric material of the third dielectric layer provided in the contact hole accordingly extends to the bottom to the contact hole in the second dielectric layer.

Alternatively, the conductive line portions arranged in the contact holes in the first lateral direction comprise an upper region and a lower region, the upper region having a width corresponding to the width of the conductive line and the lower region having a width corresponding to the width of the contact holes, the lower regions being arranged in direction normal to the second dielectric layer at a distance from an upper surface of the second dielectric layer. Though the lower region of the conductive line portion in each contact hole extends beyond the width of the bitlines, there is provided, a vertical distance in direction perpendicular to the main surface of the substrate which reduces the risk of short circuits even in case that an adjacent bitline is arranged laterally close to the contact hole in the second dielectric layer. Preferably, the distance between the lower regions of the conductive line portions and the upper surface of the second dielectric layer, in direction normal to the second dielectric layer, is at least 10%, preferably between 20% and 90% of the thickness of the second dielectric layer.

Preferably, the lower regions are covered with a third dielectric layer extending into the contact holes and surrounding the conductive lines.

Preferably, the active areas are formed line-shaped and are extending along a second lateral direction perpendicular to the first lateral direction. Furthermore, the substrate preferably comprises line-shaped trench isolation fillings arranged between the line-shaped active areas. The conductive lines preferably, are extending along the second lateral direction, that is parallel to the active areas.

Preferably, the conductive lines are arranged at same lateral positions in the first direction as the trench isolation fillings. Accordingly, in the first direction, the conductive lines are arranged in centered positions between respective to active areas.

Preferably, the contact hole fillings of the first dielectric layers are connecting two respective line-shaped active areas to a same respective conductive line. Thereby a memory array of memory cells, preferably flash memory cells, formed as a virtual ground array may be formed.

Preferably, each contact hole filling of the first dielectric layer is passing across one respective trench isolation filling. Furthermore, preferably the conductive lines are arranged, in the first lateral direction, in a centered position on the respective contact hole filling.

According to a preferred embodiment using NROM technology, the semiconductive product comprises a charge trapping layer arranged above the substrate. Preferably, the charge trapping layer is sandwiched between a bottom oxide layer and a top oxide layer. Instead of oxide layers, other dielectric liners may be provided. The charge trapping layer preferably is a silicon nitride layer which stores electrical charges in spatially bound positions. Electrons scattered into the charge trapping layer are unable to move within the charge trapping layer. Thereby locally bound charges are stored.

The semiconductor product preferably comprises wordlines extending along the first direction and crossing over the active areas. Preferably, the contact hole fillings of the first dielectric layer are located such that two respective line-shaped active areas separated from one another by one single respective trench isolation filling are commonly contacted by every other contact hole filling arranged along the second lateral direction.

Finally, the semiconductor product preferably is a memory product comprising a plurality of non-volatile memory cells. The memory cells preferably are contained in a virtual ground array.

BRIEF DESCRIPTION OF THE DRAWINGS

The invention is described below with reference to the figures.

The following list of reference symbols can be used in conjunction with the figures:
1 semiconductor product
2 substrate
3 active area
4 trench insulation filling
5 bottom oxide layer
6 charge trapping layer 7 top oxide layer
8; 18 recess
9 contact hole (in first dielectric layer)
10 first dielectric layer
11 contact hole filling
11a first conductive layer
12 second dielectric layer
12a upper surface
13 contact hole (in second dielectric layer)
13a sidewall
14 conductive line
14a conductive layer
15 conductive line portion
16 conductive material
17 wordline
19 third dielectric layer
24 upper region
25 lower region
d width (of conductive line 14)
D width (of contact hole 13)
dc critical distance
x first lateral direction
y second lateral direction
z vertical direction

DETAILED DESCRIPTION OF ILLUSTRATIVE EMBODIMENTS

Figure 1:
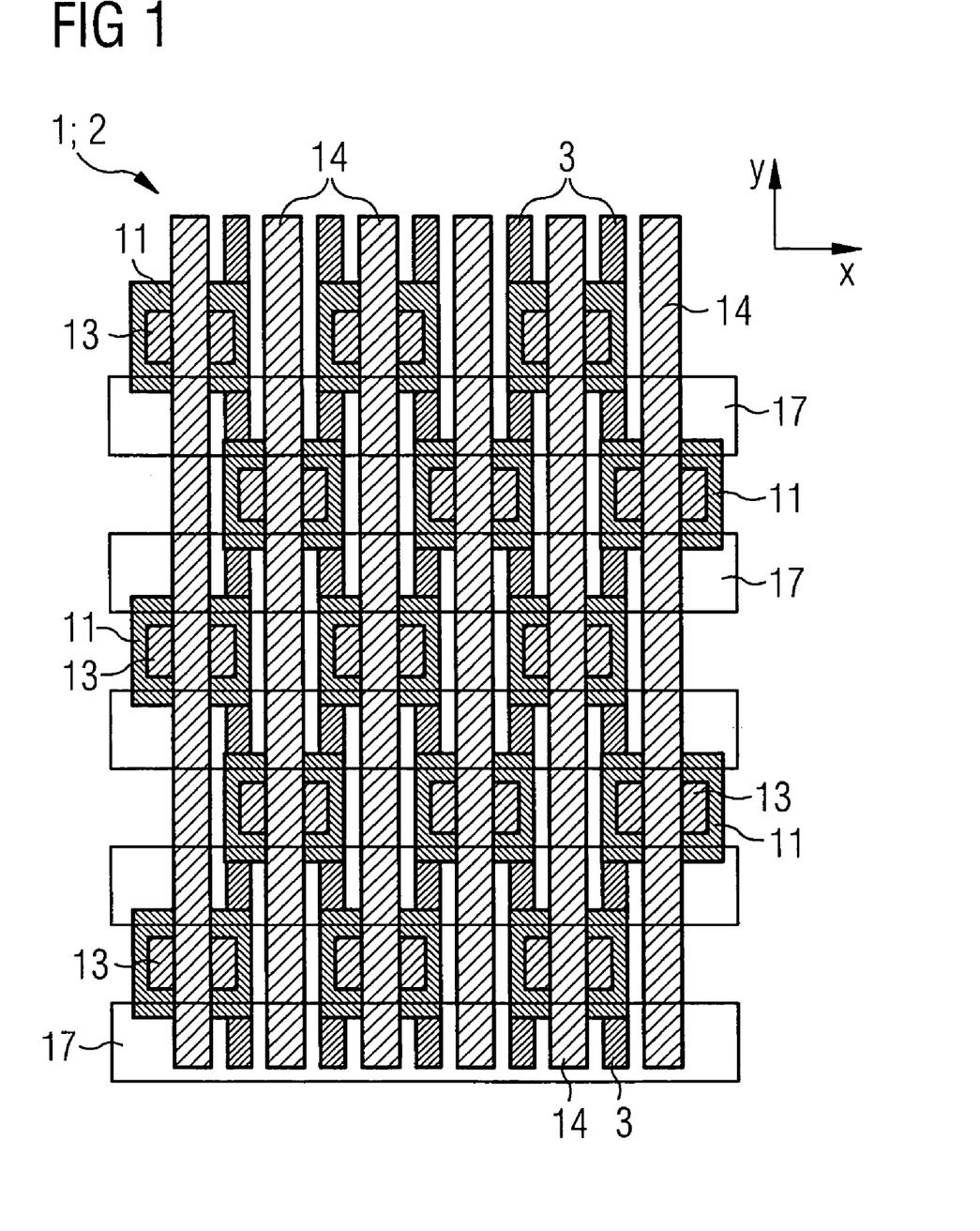
FIG. 1 is a top view of the semiconductor product according to the invention.

FIG. 1 illustrates a top view on a semiconductor product 1. In particular, a flash memory product comprising a plurality of memory cells arranged in a virtual ground array. In a substrate 2, a plurality of line-shaped active areas 3 are formed by implanting a dopant in the substrate 2. For instance, a substrate comprising line-shaped trench insulation fillings is provided. In FIG. 1, the trench insulation fillings are not illustrated since they are provided at the same lateral positions as the conductive lines 14. Since the trench insulation fillings are formed line-shaped, line-shaped active areas 3 are defined between two respective trench insulation fillings.

FIG. 1 further illustrates contact hole fillings 11 arranged in and surrounded by a first dielectric layer (not illustrated in FIG. 1) and connected to two respective line-shaped active areas 3. In FIG. 1, a circumferential outer region of the contact hole fillings 11 is illustrated in a different manner compared to an inner region of the contact hole fillings 11, thereby illustrating that the outer region of the contact hole fillings 11 is covered with a second dielectric layer (not illustrated in FIG. 1), whereas an inner region of the contact hole fillings 11 is exposed by a contact hole 13 provided in the second dielectric layer. On a surface of the substrate 2, an ONO layer stack (oxide-nitride-oxide) is provided. The ONO layer stack may be present, for instance, all over the substrate surface except for those regions of the substrate surface where the contact hole fillings 11 are provided. In this case, the formation of the contact hole fillings 11 includes etching through the ONO layer stack. Alternatively, prior to formation of the contact hole fillings 11, the ONO layer stack may be present on the active areas exclusively, for instance, and may be absent on the trench insulating fillings. In any case, the contact hole fillings 11 are in contact with the substrate surface and each contact hole filling 11 contacts two line-shaped active areas 3. Since a nitride layer of the ONO stack serves as a charge-trapping layer for storing electrical charges in locally bound positions, an NROM memory product is provided, those portions of the line-shaped active areas 3 being covered with the contact hole fillings 11 forming source/drain electrodes. The contact hole fillings 11 are arranged in rows along the first lateral direction x. When comparing the contact hole fillings 11 of two adjacent rows, the contact hole fillings 11 have a lateral offset in direction x with respect to one another. Between the rows of contact hole fillings 11, wordlines 17 are provided. The wordlines 17 have been formed prior to forming the contact hole fillings 11. In particular, contact holes in the first dielectric layer have been etched selectively to the wordlines 17.

FIG. 1 further illustrates conductive lines 14 arranged above the substrate. The conductive lines 14 in particular are bitlines, each bitline being connected to a respective plurality of contact hole fillings 11. In a conventional semiconductor product, second contacts arranged vertically between the contact hole fillings 11 and the conductive lines 14 would be provided, these additional contacts requiring separate manufacturing steps and requiring exact alignment of lithographic masks for bitline etching with respect to the lateral positions of these additional second contacts.

According to embodiments of the invention, however, the conductive lines 14 are extending into the contact holes 13 of the second dielectric layer and are directly contacting the upper surfaces of the contact hole fillings 11 at the bottom of the contact holes 13. Furthermore, those portions of the conductive lines extending into the contact holes 13 preferably have the same width as the portions of the conductive lines 14 passing over the respective plurality of contact holes 13.

Figure 2:
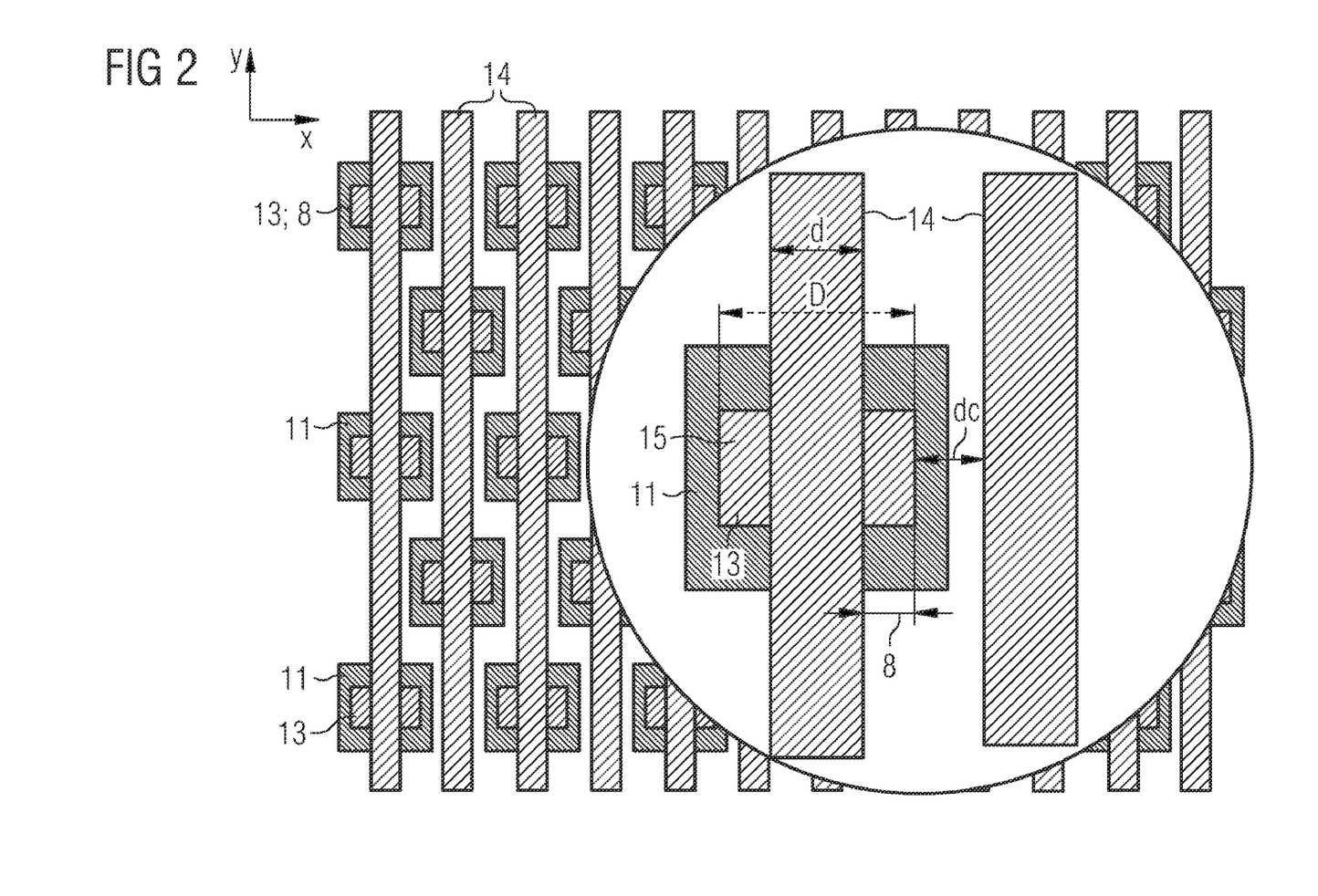
FIG. 2 is a partially enlarged top view of the semiconductor product of FIG. 2 and FIGS. 3 to 11 are cross-sectional views of a semiconductor product according to a method according to the present invention.

FIG. 2 illustrates a partially enlarged view of the semiconductor product of FIG. 1. In FIG. 2, the active areas 3 and the wordlines 17 are not illustrated. Instead, FIG. 2 shows the contact hole fillings 11, the conductive lines 14 and the contact holes 13 in the second dielectric layer (not shown). According to the invention the way of connecting the conductive lines 14 to the contact hole fillings 11 is improved.

The second dielectric layer is present above the substrate at a vertical position less than the vertical position of the conductive lines 14, but larger than the vertical position of the contact hole fillings 11. The outer regions of the contact hole fillings 11, as well as, the regions laterally surrounding the contact hole fillings 11 are covered with the second dielectric layer as apparent from the illustrated contact holes 13 of the second dielectric layer indicating where the second dielectric layer is absent.

In the enlarged portion of FIG. 2, one contact hole filling 11 and one conductive line 14 passing over the contact hole filling 11 are illustrated. Furthermore, an adjacent conductive line 14 is illustrated which passes at a lateral distance beside the contact hole filling 11 without contacting it. The conductive line 14 has a width d in the first lateral direction x and is extending along a second lateral direction y different from and perpendicular to the first lateral direction x. The contact hole 13 in the second dielectric layer has a width D, in the first lateral direction x, which is larger than the width d of the conductive line 14 in the first lateral direction x. Accordingly, only a portion of the width D of the contact hole 13 is covered with the conductive line 14. On opposed sides of the conductive line 14, the upper surface of the contact hole filling 11 is exposed by recesses 8 (outer regions of the contact hole 13 reopened by bitline etching). The conductive line 14, passing over the contact hole 13, comprises a conductive line portion 15 extending into the contact hole 13, and contacting the upper surface of the contact hole filling 11. Thereby the conductive line 14 is in direct contact with the contact hole filling 11. The contact hole filling 11 is an interconnect structure like in conventional semiconductor products. The portions 24 of the conductive line 14 extending into the contact hole 13 remove the need to form separate "contact to interconnect" structures which would require additional process steps. Furthermore, no problem of alignment occurs since, due to the width of the recesses 8 on opposed sides of the conductive line 14, additional margin is provided for a lateral offset of the conductive line 14 with respect to the contact hole 13 along the first direction x. As long as the distance dc between the sidewall of the conductive line 14 passing beside the contact hole filling 11 and the sidewall of the contact hole 13 is larger than zero, no risk of short-circuits between the passing conductive line and the contact hole filling 11 occurs. Thereby bitline-to-bitline shorts are prevented.

FIGS. 3 to 11 illustrate cross-sectional views of a semiconductor product during method steps of a method according to the present invention.

Figure 3:
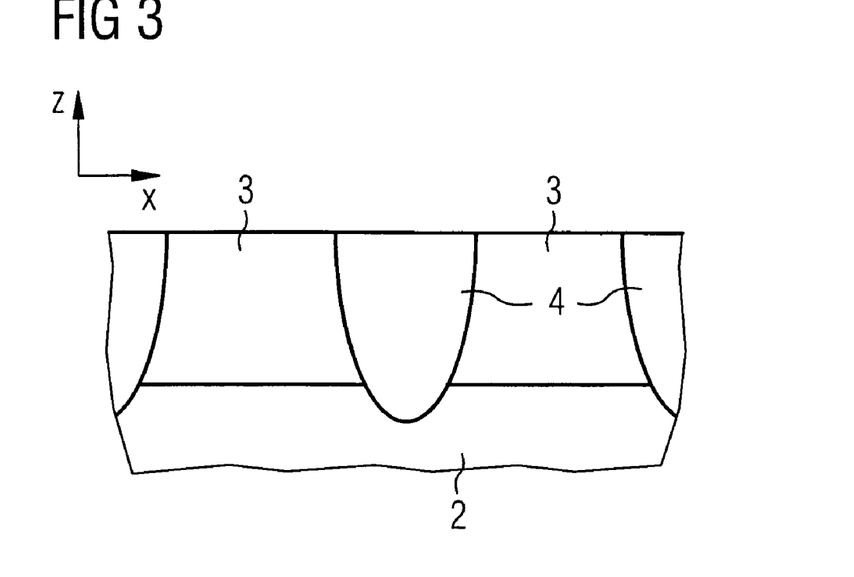

According to FIG. 3, the substrate 2 is provided, the substrate 2 comprising line-shaped trench isolation fillings 4 (shallow trench isolations; STI) provided in a predefined distance from one another in a first lateral direction x. The substrate further comprises line-shaped active areas 3 provided between the trench isolation fillings 4. The substrate 2 is a p-doped or an n-doped substrate. The active areas 3 are doped regions doped with a dopant of opposite dopant type than the substrate 2 near the active areas 3. The active areas 3 serve to form source/drain regions for non-volatile memory cells like NROM cells or, alternatively, floating gate cells.

Figure 4:
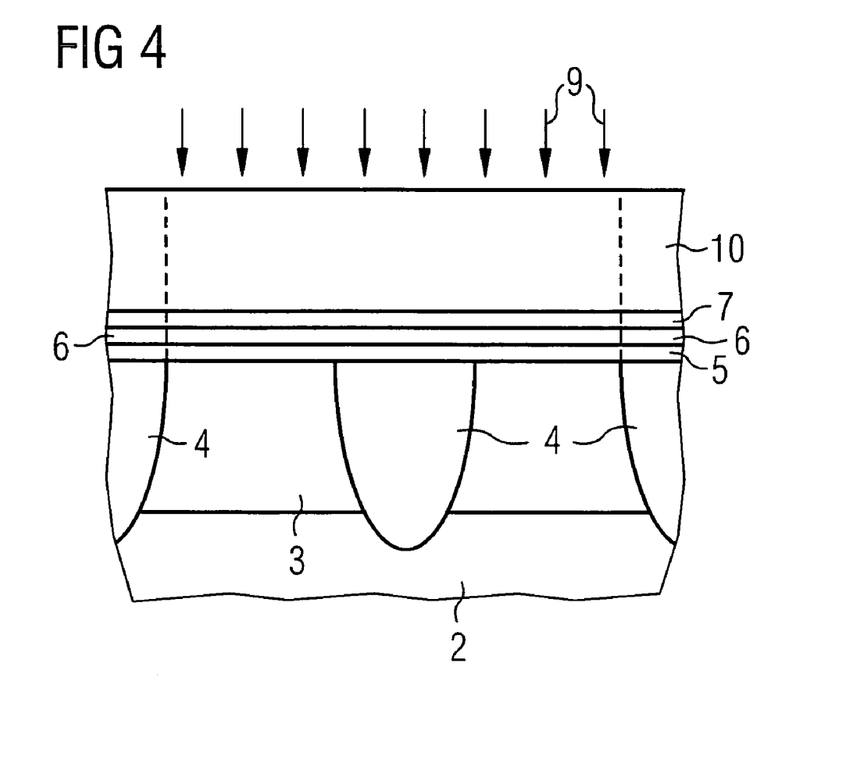

According to FIG. 4, a bottom oxide layer 5 is deposited on the upper surface of the substrate 2. A nitride layer, for instance a silicon nitride layer 6, is deposited on the bottom oxide layer 5. A top oxide layer 7 is deposited on the nitride layer 6. The layers 5, 6, 7 form a layer stack to be used for storing electrical charges in locally bound positions within the nitride layer 6. The nitride layer 6 is a charge-trapping layer used in NROM memory products (nitride read only memory) or in other kinds of flash memories. The layers 5, 6 and 7 form an ONO layer stack (oxide-nitride-oxide). The material of layers 5 and 7 may be silicon oxide, another oxide or another material rather than an oxide. According to FIG. 4, a first dielectric layer 10 is deposited on the top side layer 7 of the layer stack. Subsequently, contact holes 9 are etched in the first dielectric layer 10. The contact holes 9 are also etched through layers 7, 6 and 5 and thereby extend to the surface of the semiconductor substrate 2. The contact holes 9 in the first dielectric layer 10 serve for formation of contact hole fillings contacting the active areas 3. As illustrated in FIGS. 1 and 2, the contact holes for the contact hole fillings 11 are arranged such that each contact hole filling 11 contacts regions of two respective line-shaped active areas 3.

Figure 5:
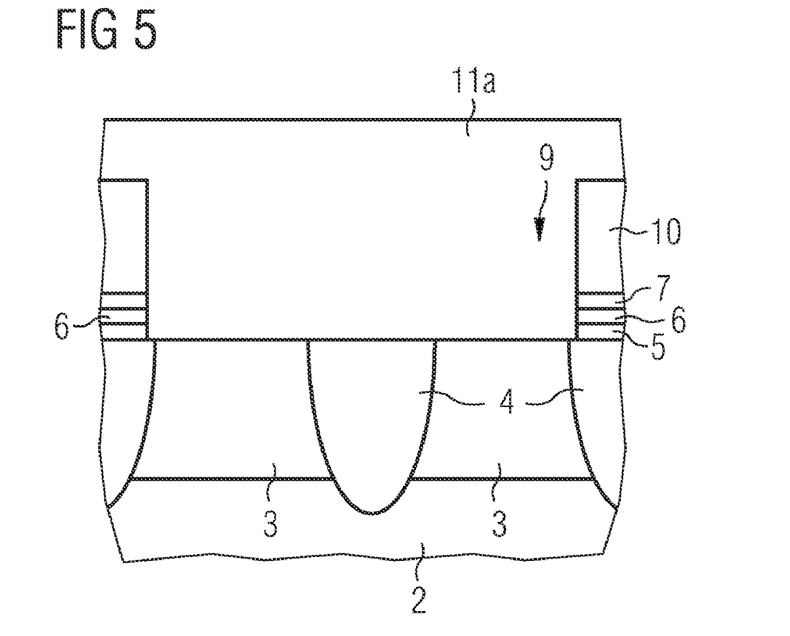

According to FIG. 5, a first conductive layer 11a is deposited, thereby filling the contact holes 9 of the first dielectric layer 10 and covering the first dielectric layer 10. The upper surface of the intermediate semiconductor product is then etched, preferably by planarizing by means of chemical-mechanical polishing, thereby removing those portions of the first conductive layer 11a arranged above the first dielectric layer 10.

Figure 6:
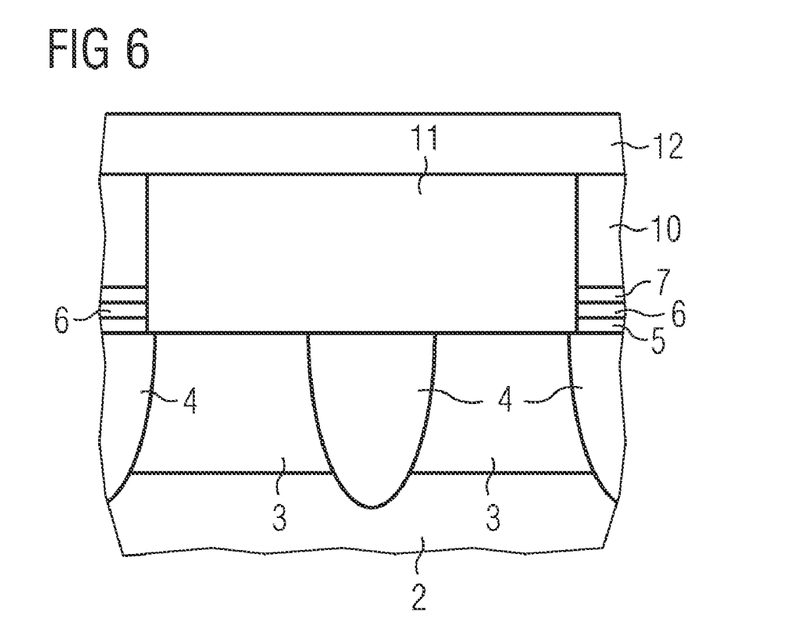

As illustrated in FIG. 6, by planarizing the first conductive layer 11a of FIG. 5, a plurality of contact hole fillings 11 isolated from one another is formed in the first dielectric layer 10, the contact hole fillings 11 each contacting two active areas 3. Furthermore, according to FIG. 6, a second dielectric layer 12 is deposited. The second dielectric layer 12 is then patterned in order to form contact holes 13 in the second dielectric layer 12 as illustrated in FIG. 7.

Figure 7:
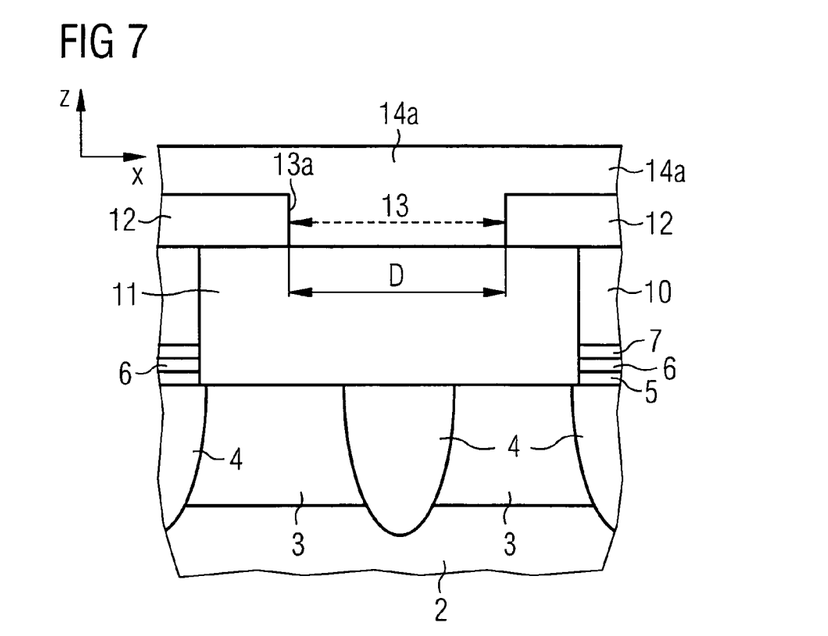

According to FIG. 7, the contact holes 13 in the second dielectric layer 12 have a width D in the first lateral direction x which is smaller than the width of the contact hole fillings 11 in the first dielectric layer 10. However, the width D of the contact holes 13 in the second dielectric layer 12 is larger than the width of conductive bitlines to be produced later. The width D of the contact hole 13 along the first lateral direction x corresponds to the distance between two opposite sidewalls 13a of the material of the second dielectric layer 12. As illustrated in FIG. 7, a second conductive layer 14a is deposited, thereby filling the contact holes 13 of the second dielectric layer 12 and covering the upper surface of the second dielectric layer 12.

Figure 8:
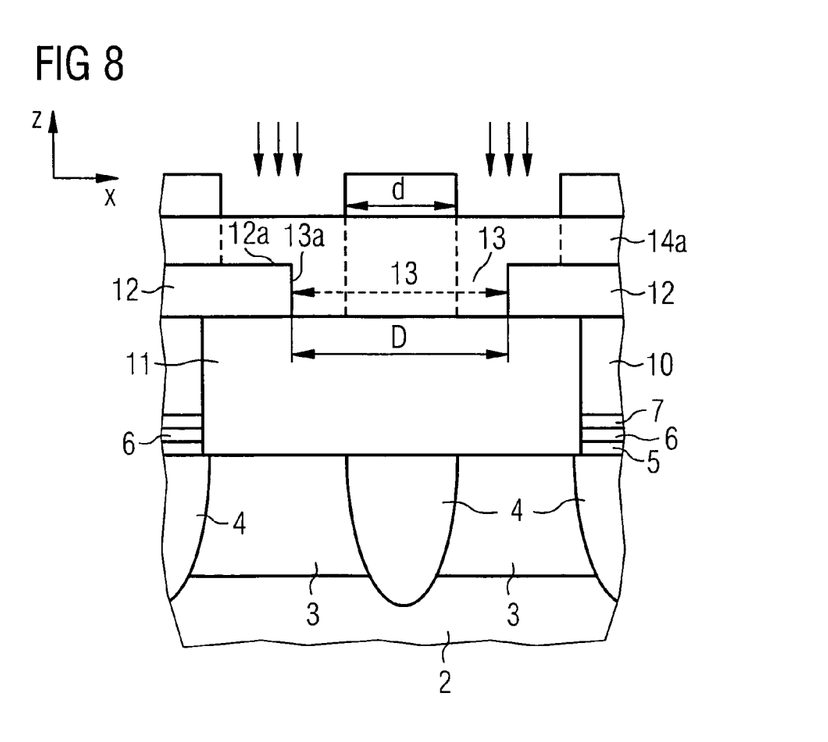
Figure 9:
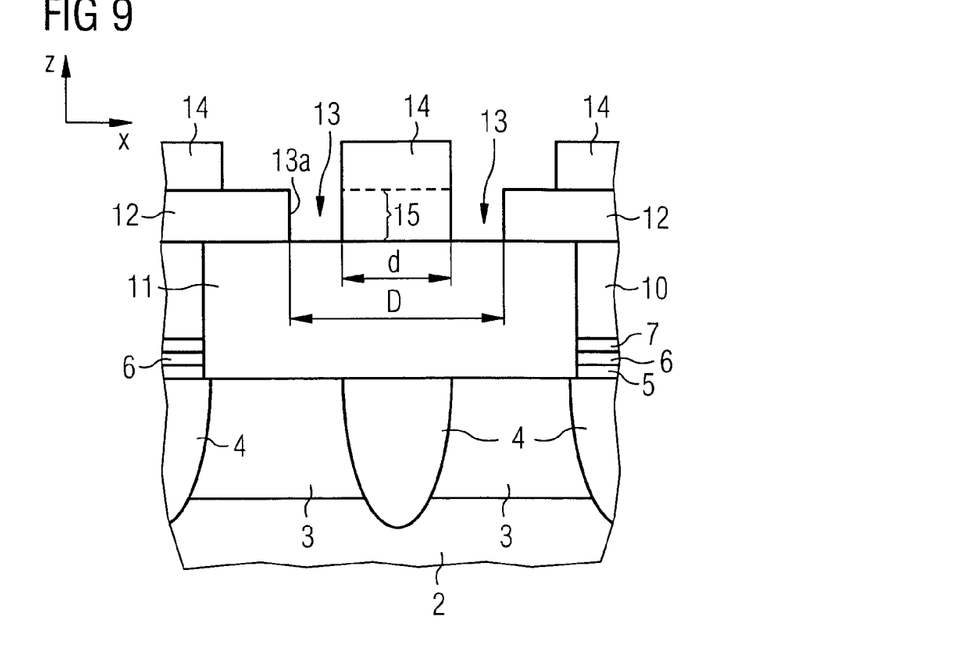

According to FIG. 8, the second conductive layer 14a is patterned using a mask of line-shaped mask patterns provided on the upper surface of the second conductive layer 14a. The line-shaped mask patterns of the mask each have a width d corresponding to the width of conductive lines to be etched. The lateral positions of the line-shaped mask patterns in the first lateral direction x are such that in the drawing plane every other conductive line to be formed will contact a respective contact hole filling 11 in the first dielectric layer 10, whereas, the remaining conductive lines to be formed are passing between two respective contact holes 13 in the second dielectric layer 12. According to prior art processes, the second conductive layer 14a is only etched back to the upper surface 12a of the second dielectric layer since in conventional semiconductor products the contact holes 13 are filled with additional contact to interconnect structures. Furthermore, in conventional semiconductor products the contact holes 13 have the same width in lateral direction x as the conductive lines to be formed. According to the invention, however, the width of the contact hole 13 in the first lateral direction x is larger than the width d of the conductive lines to be formed. Furthermore, the contact holes 13 according to the invention, are filled with conductive material forming the conductive lines. Accordingly, when patterning the second conductive layer 14a, etching is continued after the upper surface 12a of the second dielectric layer 12 is exposed in order to remove or at least to recess conductive material of the second conductive layer 14a arranged within the contact hole 13 of the second dielectric layer 12 (FIG. 9).

Figure 10A:
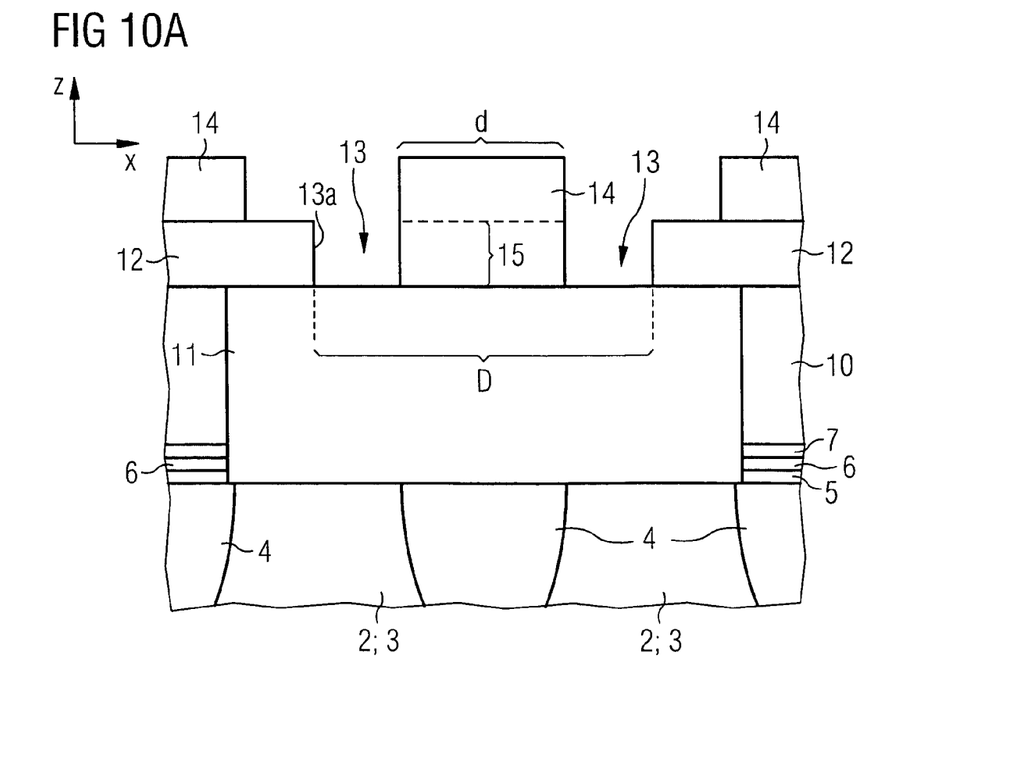

According to a first embodiment illustrated in FIG. 10A, the second conductive layer 14a has been patterned thereby leaving conductive lines 14 serving as bitlines on the second dielectric layer 12. In the drawing plane, every second conductive line 14 is in contact with a respective contact hole filling 11 and to this end extends into a respective contact hole 13. In particular, a conductive line portion 15 of the respective conductive line 14 fills a portion of the contact hole 13 and has a width d corresponding to the width d of the conductive line 14 but being smaller than the width D of the contact hole 13 in direction x, that is the distance between two opposite sidewalls 13a of the contact hole 13. Due to some misalignment or offset of the mask used in FIG. 8 for patterning the second conductive layer 14a, on opposed sides of the conductive line 14 the recesses 8 may have a different width in direction x. However, as long as the lateral offset of the conductive lines 14 is smaller than a critical distance dc illustrated in FIG. 2, no short circuits between adjacent bitlines occur (which would be the case if two adjacent bitlines both would contact the same contact hole filling 11 via the contact hole 13).

According to the first embodiment of the invention illustrated in FIG. 10A, the conductive material provided laterally outside the width d of the conductive line 14 passing over the contact hole 13 is completely removed. Accordingly, the upper surface of the contact hole filling 11 is exposed in regions of the contact hole 13 laterally outside the width d of the conductive line 14.

Figure 10B:
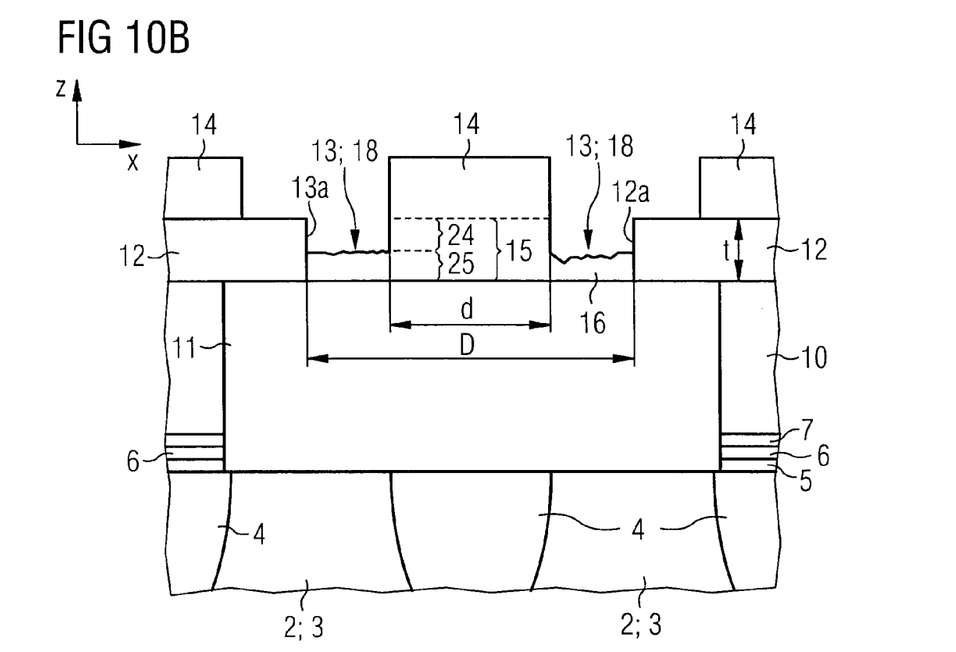

According to an alternative embodiment illustrated in FIG. 10B, the patterning of the second conductive layer 14a is stopped after the upper surface 12a of the second dielectric layer 12 is exposed but before the upper surface of the contact hole filling 11 is exposed. The conductive line portion 15 provided in the contact hole 13 is patterned only in an upper portion. Instead of completely removing any conductive material of the second conductive layer 14a provided in the contact hole 13, only in an upper portion of the thickness of the second dielectric layer 12 in the second conductive layer 14a is patterned. Thereby a conductive line portion 15 is formed which comprises an upper region 24 and a lower region 25, the upper region 24 having the same width d as the conductive line 14 passing over the contact hole 13. The lower portion 25 of the conductive line portion 15, has a width D corresponding to the width D of the contact hole 13 in the first lateral direction. According to the embodiment illustrated in FIG. 10B, recesses 18 having a height of between 10% and 100%, preferably of between 20% and 90% of the layer thickness of the second dielectric layer 12 are formed. The depth of recesses provides a vertical distance between the lower region 25 of the conductive line portion 15 and those adjacent conductive lines 14 passing beside the conductive line 14 contacting the contact hole filling.

Even in case that the lateral offset of the bitlines with respect to the center of the contact holes 13 is such that one of the opposed recesses 18 has a width of almost zero, no risk of short-circuits between the lower region 25 of the conductive line portion 15 contacting the contact hole filling 11 and the adjacent bitline 14 arranged close to the respective sidewall 13a of the contact hole 13 occurs since the depth of the recesses 18, due to continued patterning of the second conductive layer 14a even after exposing the upper surface 12a of the second dielectric layer 12, a vertical distance in direction z normal to the main surface of the substrate is provided according to the invention.

Also in case that, as illustrated in FIG. 10A, conductive material of the second conductive layer 14a is completely removed in the contact hole 13 on opposed sides of the conductive line (that is outside the width d of the conductive line 14), the vertical distance between the upper side of the contact hole filling 11 and an adjacent conductive line 14 arranged close to a sidewall 13a of the contact hole 13 prevents short-circuits. In a conventional semiconductor product, however, the contact hole 13 would have a width corresponding to the width d of the conductive lines and would be completely filled with conductive material of additional contact to interconnect structures. However, if the lateral positions of the bitlines 14 are laterally offset in direction x with respect to the conductive contact to interconnect structures, a high risk of short-circuits would occur if an adjacent conductive line is passing near a sidewall of a conductive contact to interconnect structure.

According to the invention, the conductive line portion 15 extending into the contact hole replaces the need to manufacture such contact to interconnect structures by additional process steps. Instead, the conductive lines 14 and the conductive line portions 15 extending into the recesses 13, are formed by one and the same etching step, thereby automatically achieving alignment of the conductive lines 14 with respect to the conductive line portions 15.

The contact hole filling 11 in the first dielectric layer 10 serves to connect two line-shaped active areas 3 to the conductive line 14 passing over the contact hole filling 11 in a centered position. Accordingly, the contact hole filling 11 preferably serves as a local interconnect structure in a flash memory product comprising memory cells arranged in a virtual ground array.

Figure 11:
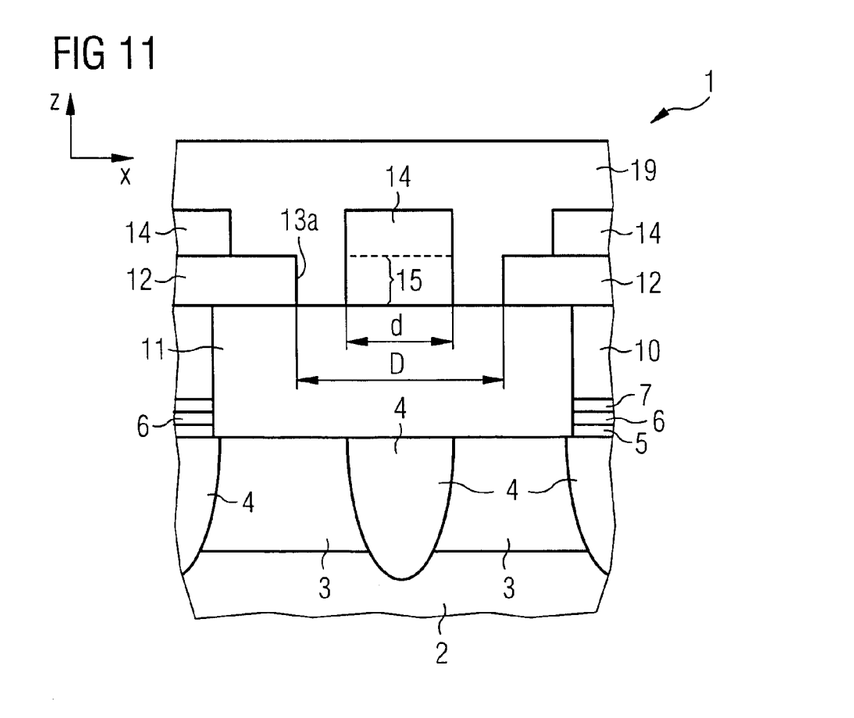

According to FIG. 11, a third dielectric layer 19 is deposited, thereby filling any recesses in the contact hole 13 and encapsulating the conductive lines 14.

Whereas FIGS. 3 to 11 illustrate cross-sectional views of the contact hole fillings 11, the wordlines not illustrated in FIGS. 3 to 11 are arranged above and below the respective drawing plane. The lateral positions of the wordlines are illustrated in a top view of FIG. 1. During the process of routine, the first dielectric layer 10 is deposited after the wordlines have been formed and encapsulated with spacers. Accordingly, when the contact holes for the contact hole fillings 11 are formed, the contact holes are formed in a self-aligned manner with respect to the wordlines being provided in the first dielectric layer 10.

The contact hole fillings 11, may be formed of aluminum or other metals or metallic alloys or of doped silicon like doped polysilicon. The first dielectric layer may be formed of BPSG (Borous Phosphorous Silicate Glass). The second dielectric layer may be formed of silicon dioxide. The second conductive layer 14a forming the conductive lines may comprise aluminum, aluminum-copper-alloys or any other conductive material. The thickness of the second dielectric layer (serving as an interlayer dielectric) may be 40 to 100 nm. The thickness of the second dielectric layer should be at least 20 nm. Preferably the width of the bitlines is equal to the distance between two respective bitlines adjacent to one another.

What is claimed is:

1. A method for forming a semiconductor product, the method comprising:
    providing a substrate comprising active areas,
    depositing a first dielectric layer,
    etching contact holes in the first dielectric layer for contacting the active areas,
    depositing a first conductive layer thereby filling the contact holes in the first dielectric layer and forming a plurality of contact hole fillings in the first dielectric layer,
    depositing a second dielectric layer having an upper surface,
    etching contact holes in the second dielectric layer, each contact hole in the second dielectric layer exposing a portion of a surface of a respective contact hole filling of the first dielectric layer and having a width in a first lateral direction,
    depositing a second conductive layer, filling the contact holes of the second dielectric layer and covering the second dielectric layer, and
    patterning the second conductive layer thereby forming conductive lines, each conductive line passing over a plurality of contact holes of the second dielectric layer and having a width in the first lateral direction being smaller than the width of the contact holes of the second dielectric layer, wherein a top surface of a conductive material of the second conductive layer that is provided in the contact holes of the second dielectric layer and that is arranged, in the first lateral direction, outside the width of the respective conductive line passing over the respective contact hole, is at least recessed below the upper surface of the second dielectric layer.

2. The method of claim 1, wherein the conductive material that is provided in the contact holes of the second dielectric layer and that is arranged, in the first direction, outside the width of the respective conductive line passing over the respective contact hole, is removed completely.

3. The method of claim 2, wherein, while patterning the second conductive layer, portions of surfaces of the contact hole fillings of the first dielectric layer are exposed when the conductive material arranged in the contact holes of the second dielectric layer outside the width of the conductive lines is removed.

4. The method of claim 2, wherein recesses between sidewalls of the contact holes of the second dielectric layer and sidewalls of conductive line portions of the conductive lines arranged in the contact holes are formed outside the width of the conductive lines, the recesses exposing the contact hole fillings provided in the first dielectric layer.

5. The method of claim 1, wherein the conductive material arranged in the contact holes of the second dielectric layer outside the width of the respective conductive line is recessed below the upper surface of the second dielectric layer, thereby forming recesses having a depth larger than 20% of a thickness of the second dielectric layer.

6. The method of claim 5, wherein the conductive material of the second conductive layer is maintained in the contact holes outside the width of the respective conductive line passing over the respective contact hole, the conductive material maintained being arranged at a distance from the upper surface of the second dielectric layer in direction normal to the second dielectric layer.

7. The method of claim 1, further comprising:
depositing a third dielectric layer, thereby filling portions of the contact holes of the second dielectric layer provided outside the width of the respective conductive line passing over the contact holes with dielectric material.

8. The method of claim 7, wherein depositing the third dielectric layer causes spaces between conductive lines adjacent to one another to be filled.

9. The method of claim 1, further comprising, planarizing the first conductive layer, thereby exposing an upper surface of the first dielectric layer.

10. The method of claim 1, wherein etching contact holes in the second dielectric layer includes reactive ion etching of the second dielectric layer.

11. The method of claim 1, wherein providing a substrate comprises providing a substrate comprising active areas formed line-shaped and extending along a second lateral direction is provided.

12. The method of claim 11, wherein the substrate further comprises trench isolation fillings between the line-shaped active areas.

13. The method of claim 11, wherein patterning the second conductive layer comprises forming conductive lines running along the second lateral direction.

14. The method of claim 12, wherein forming the plurality of contact hole fillings in the first dielectric layer comprises forming contact hole fillings exposing portions of two respective line-shaped active areas and passing across one respective trench isolation filling.

15. The method of claim 12, wherein patterning the second conductive layer comprises forming conductive lines that are smaller, in the first lateral direction, than a width of a contact hole filling in the first dielectric layer.

16. The method of claim 15, wherein the width of the contact holes of the second dielectric layer, in the first lateral direction, is less than the width of the contact hole fillings in the first dielectric layer.

17. The method of claim 1, wherein providing a substrate comprises providing a substrate that includes a charge trapping layer disposed above the active areas and wherein etching contact holes in the first dielectric layer includes locally etching through the charge trapping layer when the contact holes are formed.

18. The method of claim 17, wherein the substrate comprises a charge trapping layer sandwiched between a bottom oxide layer and a top oxide layer.

19. The method of claim 17, wherein the charge trapping layer comprises a silicon nitride layer.

20. The method of claim 1, further comprising, prior to depositing the first dielectric layer, forming wordlines, the wordlines extending along the first lateral direction and crossing over the active areas.

21. The method of claim 20, wherein the contact hole fillings in the first dielectric layer are formed such that each contact hole filling contacts two respective line-shaped active areas separated from one another by one single trench insulation filling.

22. The method of claim 20, wherein the contact hole fillings in the first dielectric layer are located such that two respective line-shaped active areas separated from one another by one single trench insulation filling are commonly contacted by every other contact hole filling arranged along the second lateral direction.

* * * * *